United States Patent
Teng

(10) Patent No.: US 8,148,048 B2
(45) Date of Patent: Apr. 3, 2012

(54) METHOD OF PROCESSING ON-PRESS DEVELOPABLE LITHOGRAPHIC PRINTING PLATE HAVING OVERCOAT

(76) Inventor: Gary Ganghui Teng, Northborough, MA (US)

(*) Notice: Subject to any disclaimer, the term of this patent is extended or adjusted under 35 U.S.C. 154(b) by 648 days.

(21) Appl. No.: 12/030,867

(22) Filed: Feb. 14, 2008

(65) Prior Publication Data

US 2009/0208874 A1 Aug. 20, 2009

(51) Int. Cl.
*G03C 1/00* (2006.01)
*G03F 7/00* (2006.01)

(52) U.S. Cl. .............. 430/302; 101/453; 430/271.1; 430/281.1

(58) Field of Classification Search ............ 430/302; 101/450.1
See application file for complete search history.

(56) References Cited

U.S. PATENT DOCUMENTS

| | | | |
|---|---|---|---|
| 5,599,650 A | 2/1997 | Bi et al. ............... | 430/273.1 |
| 5,677,110 A | 10/1997 | Chia et al. ............ | 430/302 |
| 6,482,571 B1 | 11/2002 | Teng .................... | 430/302 |
| 6,541,183 B2 | 4/2003 | Teng .................... | 430/303 |
| 6,689,537 B2 | 2/2004 | Urano et al. ........... | 430/273.1 |
| 6,740,464 B2 | 5/2004 | Maemoto ................ | 430/138 |
| 7,213,516 B1 | 5/2007 | Teng .................... | 101/451 |
| 7,297,467 B2 | 11/2007 | Vander Aa ............... | 430/302 |
| 7,709,184 B2 * | 5/2010 | Teng .................... | 430/302 |
| 2003/0143488 A1* | 7/2003 | Teng .................... | 430/303 |
| 2003/0186165 A1 | 10/2003 | Gries et al. ............ | 430/281.1 |
| 2006/0251993 A1* | 11/2006 | Teng .................... | 430/302 |
| 2007/0072119 A1* | 3/2007 | Iwai et al. ............. | 430/270.1 |
| 2008/0008975 A1 | 1/2008 | Oosterlaken et al. ...... | 430/270.1 |
| 2009/0095184 A1* | 4/2009 | Vermeersch et al. ...... | 101/463.1 |

* cited by examiner

*Primary Examiner* — Cynthia Kelly
*Assistant Examiner* — Chanceity Robinson

(57) ABSTRACT

A method of processing an on-press developable lithographic printing plate involving the removal of the overcoat after laser imaging and before on-press development is described. The plate comprises a substrate, an on-press ink and/or fountain solution developable photosensitive layer, and an overcoat. The laser imaged plate is mechanically stripped off the overcoat, and then developed with ink and/or fountain solution on a lithographic press. Such a process allows the use of overcoat to achieve faster photospeed and improved durability of the plate without having various issues as related to overcoat such as contamination to the fountain solution, difficulty to remove of certain overcoat, and limited white light stability.

20 Claims, No Drawings

METHOD OF PROCESSING ON-PRESS DEVELOPABLE LITHOGRAPHIC PRINTING PLATE HAVING OVERCOAT

FIELD OF THE INVENTION

This invention relates to lithographic printing plate. More particularly, it relates to a method of removing the overcoat of an on-press developable lithographic plate after imagewise exposure and before on-press development.

BACKGROUND OF THE INVENTION

Lithographic printing plates (after process) generally consist of ink-receptive areas (image areas) and ink-repelling areas (non-image areas). During printing operation, an ink is preferentially received in the image areas, not in the non-image areas, and then transferred to the surface of a material upon which the image is to be produced. Commonly the ink is transferred to an intermediate material called printing blanket, which in turn transfers the ink to the surface of the material upon which the image is to be produced.

At the present time, lithographic printing plates (processed) are generally prepared from lithographic printing plate precursors (also commonly called lithographic printing plates) comprising a substrate and a photosensitive coating deposited on the substrate, the substrate and the photosensitive coating having opposite surface properties. The photosensitive coating is usually a photosensitive material, which solubilizes or hardens upon exposure to an actinic radiation, optionally with further post-exposure overall treatment. In positive-working systems, the exposed areas become more soluble and can be developed to reveal the underneath substrate. In negative-working systems, the exposed areas become hardened and the non-exposed areas can be developed to reveal the underneath substrate. Conventionally, the plate is exposed with an ultraviolet light from a lamp through a separate photomask film having predetermined imaging pattern that is placed between the light source and the plate, and the exposed plate is developed with a liquid developer to bare the substrate in the non-hardened or solubilized areas. Laser sources have been increasingly used to imagewise expose a printing plate that is sensitized to a corresponding laser wavelength, allowing the elimination of the photomask film.

On-press developable lithographic plates have been disclosed in the literature. Such plates can be directly mounted on press after imagewise exposure to develop with ink and/or fountain solution during the initial prints and then to print out regular printed sheets. No separate development process before mounting on press is needed, allowing the reduction of labor and the elimination of hazardous waste. Among the patents describing on-press developable lithographic printing plates are U.S. Pat. Nos. 5,258,263, 5,516,620, 5,561,029, 5,616,449, 5,677,110, 5,811,220, 6,014,929, 6,071,675, and 6,482,571.

Laser sensitive on-press developable lithographic plates generally comprise on a substrate a photosensitive layer. A water-soluble overcoat is usually further coated on the photosensitive layer to achieve fast photospeed as required for laser imaging. Such an overcoat is typically removed on press with fountain solution during on-press development. Although removing the overcoat by rinsing with water has been suggested in the patent literature, such water rinse introduces additional liquid waste.

While laser sensitive on-press developable lithographic plates having a water-soluble overcoat allow fast photospeed, it has the drawbacks of contamination to the fountain solution and/or limited white room light stability. It would be desirable if a laser sensitive on-press developable lithographic plate and/or method of using it can be designed so that the plate can have fast photospeed during laser exposure, does not cause contamination to the fountain solution, can be handled freely or more freely under white room light during on-press development, and does not generate liquid waste.

The inventor has found that such a desire can be achieved by a method of mechanically peeling off the overcoat of a lithographic plate after laser exposure and before on-press development.

SUMMARY OF THE INVENTION

According to the present invention, there has been provided a method of processing a lithographic printing plate, comprising in order:
(a) providing a lithographic plate comprising (i) a substrate, (ii) a photosensitive layer, and (iii) an overcoat; said photosensitive layer being soluble or dispersible in ink and/or fountain solution and capable of hardening upon exposure to a laser having a wavelength selected from 200 to 1200 nm;
(b) imagewise exposing said plate with said laser to cause hardening of said photosensitive layer in the exposed areas;
(c) removing said overcoat from said plate by mechanical peeling; and
(d) developing said plate with ink and/or fountain solution on a lithographic press to remove the photosensitive layer in the non-hardened areas.

The plate is imagewise exposed with a laser on a laser imager, stripped off the overcoat by mechanical peeling, and then mounted on press for development with ink and/or fountain solution and lithographic printing. The overcoat can be removed by any means which applies a mechanical force to pull off or drive off the overcoat from the plate, such as peeling off with an adhesive tape, with vacuum suction, with air blowing, by a clamp, by pinching, by scratching, by brushing, or by hand. Preferably, the overcoat is peeled off from the plate using an adhesive tape, a vacuum suction, or a clamp. The overcoat can be stripped off from the plate as a single piece, 2 pieces, several pieces, or many small pieces (including small pieces of any shape) of film. It is noted that in this application the term mechanical peeling includes any method of stripping off the overcoat based on a mechanical force, such as peeling by a mechanical device, scratching off the overcoat with a brush, or peeling by hand (instead of removing the overcoat with water, a solvent or a solution by dissolution).

In the manufacture of the plate, the overcoat can be coated onto the photosensitive layer of the plate from a solution or dispersion or can be laminated from a polymeric film. Preferably, the overcoat is coated from a solution or dispersion (including emulsion), more preferably from an aqueous solution or dispersion, most preferably from an aqueous solution containing a water soluble polymer. The solution or dispersion coated on the photosensitive layer is further dried to remove any excess water and/or solvent so as to form the overcoat as a dry layer.

The photosensitive layer is negative-working, capable of hardening upon exposure to a laser having a wavelength selected from 200 to 1200 nm, preferably an infrared laser of from 750 to 1200 nm or a violet or ultraviolet laser of from 200 to 430 nm. A preferred photosensitive layer comprises a polymeric binder, a free radical polymerizable monomer, a free radical initiator, and a sensitizing dye.

The laser exposure and overcoat removal (steps b to c) can be performed with the plate under a yellow or red light (such as in a yellow or red light room) in darkness or substantial darkness (such as with the plate in an imager having light-tight covers and then in an overcoat removing device having light-tight covers), or under white room light for limited time, depending on the white light sensitivity of the plate. Preferably, the laser exposure and overcoat removal are performed with the plate under a yellow or red light, or in darkness or substantial darkness. The overcoat removal (step c) is preferably performed on an overcoat removing device that is connected to or is part of an imaging device for the laser exposure (step b).

Preferably, the on-press development is performed with the plate under a white room light, and the plate has limited white room light stability before removing the overcoat and has significantly improved white room light stability after removing the overcoat. More preferably, said on-press development is performed under a white room light, said photosensitive layer before the removal of the overcoat is capable of hardening or causing background toning of the substrate under said room light for less than a time period selected from 1 to 60 minutes, and said photosensitive layer after the removal of the overcoat is incapable of hardening or causing background toning of the substrate under said room light for tip to at least twice of said time period. Most preferably, said photosensitive layer before the removal of the overcoat is capable of hardening or causing background toning of the substrate under said white room light for less than 60 minutes (even more preferably less than 30 minutes and most preferably less than 10 minutes), and said photosensitive layer after the removal of the overcoat is incapable of hardening or causing background toning of the substrate under said white room light for up to at least 120 minutes (even more preferably up to at least 240 minutes and most preferably any amount of time).

DETAILED DESCRIPTION OF THE PREFERRED EMBODIMENTS

The lithographic plate of this invention comprises on a substrate a photosensitive layer and an overcoat. The overcoat is capable of being removed by mechanical peeling prior to mounting the plate on press for development with ink and/or fountain solution and lithographic printing.

The overcoat can be peeled off as one or more large sheets, or as many small pieces. The overcoat can be peeled off from the plate by any means. The peeled away overcoat can be substantially free of any photosensitive layer, or can be attached with some of the photosensitive layer (i.e., part of the photosensitive layer, especially in the non-hardened areas, may be carried away with the overcoat); preferably the overcoat is substantially free of any photosensitive layer. The mechanical peeling of the overcoat can be performed at room temperature or an elevated temperature, preferably at room temperature. The overcoat can be either soluble in water or insoluble in water.

The overcoat suitable for being peeled off as one or more large sheets is preferably strong enough so that the overcoat can be peeled off as one or more thin films, more preferably one thin film. Preferably, it is peeled off from the plate by pulling with a mechanical device or by hand from one end, preferably by a mechanical device. The mechanic device can be clamped to the overcoat at one end, adhered to the overcoat surface, or sucked by vacuum on the overcoat surface.

The overcoat suitable for being peeled off as many small pieces is preferably capable of being broken apart by mechanical scratching, rubbing or brushing, or by air blowing or vacuum suction. Preferably, the overcoat on the plate is brushed with a brush which is capable of breaking apart and peeling off the overcoat without damaging the photosensitive layer in the hardened areas. The peeled off overcoat pieces can be removed from the plate by vacuum suction, air blowing, brushing, rubber blade wiping, or other mechanical action, preferably by vacuum suction. The peeled off overcoat pieces can be collected in a waste vacuum bag or a container.

The overcoat may be capable of removal on press with ink and/or fountain solution (by contacting with ink roller and/or fountain solution roller) or may be incapable of removal on press with ink and/or fountain solution. For overcoat incapable of removal on press with ink and/or fountain solution, the overcoat can be water soluble or water insoluble. For example, a water soluble overcoat may be too thick to be removable on press with ink and/or fountain solution (by contacting with the ink roller and/or fountain roller). Preferably, the overcoat is incapable of removal on press with ink and/or fountain solution after contacting with the ink roller and/or fountain solution roller for up to 200 rotations of the plate cylinder. More preferably, the overcoat is incapable of removal on-press by contacting with ink roller and/or fountain solution roller.

The peeling off of the overcoat from a plate is preferably performed on an overcoat removing device. More preferably, the plate is transported through the overcoat removing device to remove the overcoat. The overcoat removing device can be a separate device from the exposure device, or can be connected to or be part of the exposure device. Preferably, the overcoat removing device is connected to or is part of the exposure device.

The overcoat can be any film-forming material which is substantially transparent to the imaging laser and is capable of being removed by mechanical peeling. The overcoat can be formed on the plate by coating from a solution or dispersion or by laminating from a polymeric film, preferably by coating from a solution or dispersion containing a film-forming polymer, more preferably by coating from an aqueous solution or dispersion containing a film-forming polymer. The coating can be performed by any known method, such as roller coating, slot coating, curtain coating, Mayer rod coating, dip coating, or spray coating, preferably roller coating or slot coating. The coated overcoat is further dried to remove the water as welt as any solvent, preferably by forced hot air drying, radiation drying, or combination of forced air drying and radiation drying. The overcoat preferably has a coverage of at least 0.5 g/m$^2$, more preferably from 1.0 to 10 g/m$^2$, even more preferably from 2.0 to 7.0 g/m$^2$, and most preferably from 3.0 to 5.0 g/m$^2$.

The plate of the instant invention (with overcoat) can be supplied as sheets or roll, preferably as stack of sheets. The plate sheets or roll may or may not have interleafing paper in between the plates. Preferably, the overcoat is durable and non-tacky enough so that no interleaving paper is required between plates when supplied. This will simplify the handling of the plate, especially during mechanical feeding of the plate to the laser imager. Because the overcoat does not need to be dissolved during the pressroom processes by the instant invention, it allows the opportunity to easily design an overcoat which is durable and non-tacky enough suitable for handling without the use of interleafing paper; preferably, such an overcoat is incapable of removal after contacting with ink and/or fountain solution on press for up to 200 rotations of the plate cylinder.

The solution or dispersion containing a film-forming polymer suitable for forming overcoat can be a water soluble polymer solution (containing water soluble polymer) or polymer dispersion (including polymer emulsion and latex, containing water-insoluble polymer, with or without addition water soluble polymer), preferably a water soluble polymer solution. A suitable water soluble polymer overcoat comprises a water-soluble polymer, such as polyvinyl alcohol (including various water-soluble derivatives of polyvinyl alcohol). Combination of two or more water-soluble polymers (such as a combination of polyvinyl alcohol and polyvinylpyrrolidone) can also be used. Polyvinyl alcohol is a preferred water-soluble polymer. Various additives, such as surfactant, wetting agent defoamer, leveling agent and dispersing agent, can be added into the overcoat formulation to facilitate, for example, the coating or development process. Examples of surfactants useful in the overcoat of this invention include polyethylene glycol, polypropylene glycol, and copolymer of ethylene glycol and propylene glycol, polysiloxane surfactants, perfluorocarbon surfactants, alkylphenyl ethylene oxide condensate, sodium dioctylsulfosuccinate, sodium dodecylbenzenesulfonate, and ammonium laurylsulfate. Various organic or inorganic micro particles may be added into the overcoat to, for example, reduce the tackiness or moisture sensitivity of the plate.

The polymeric film suitable for laminating onto the photosensitive layer to form the overcoat can be any polymeric film, such as polymer films based on polyester (including polyethylene terephthalate), polyethylene, polypropylene, ethylene/propylene copolymer, polystyrene, polyvinyl butyrol, polynitrile, polyamide, polyimide, polyvinyl chloride, polycarbonate, polymethylmethacrylate, acrylate/styrene copolymer, methacrylate/styrene copolymer, polyurethane, epoxy-amine polymer, nylon, Teflon, cellulose and its film-forming derivatives, and polyvinyl acetate. Polyester, polyethylene and polypropylene are preferred polymeric film; and polyester is more preferred.

The polymeric film can be directly laminated onto the photosensitive layer of a plate. Alternatively, the polymeric film can be pre-coated with a layer of adhesive before laminating onto the photosensitive layer of a plate (with the adhesive layer facing the photosensitive layer). Here the adhesive layer can be made of any adhesive material; preferably a pressure sensitive adhesive, a heat sensitive adhesive, a radiation-sensitive adhesive, or a moisture sensitive adhesive; more preferably a pressure sensitive adhesive. Preferably, the polymeric film is pre-coated with a layer of adhesive (more preferably a pressure sensitive adhesive) before laminating onto the photosensitive layer of the plate. The adhesive layer preferably has stronger adhesion to the film than to the photosensitive layer so that such adhesive layer comes off with the film during mechanical peeling.

The polymeric film can be laminated onto the photosensitive layer of a plate by any means, preferably by a pair of laminating rollers, with the plate at room temperature or at elevated temperature, preferably at elevated temperature. When laminating the polymeric film to the photosensitive layer of the plate at an elevated temperature, a pair of heated laminating rollers is preferably used.

The substrate employed in the lithographic plates of this invention can be any lithographic support. Such a substrate may be a metal sheet, a polymer film, or a coated paper. Aluminum (including aluminum alloy) sheet is a preferred metal support. Particularly preferred is an aluminum support that has been grained and anodized (with or without deposition of a barrier layer). Polyester film is a preferred polymeric film support. A surface coating may be coated to achieve desired surface properties. For wet plate, the substrate should have a hydrophilic or oleophilic surface, depending on the surface properties of the photosensitive layer (preferably with opposite philicity to the substrate); more preferably, a wet lithographic plate has a hydrophilic substrate and an oleophilic photosensitive layer. For waterless plate, the substrate should have an oleophilic or oleophobic surface, depending on the surface properties of the photosensitive layer (preferably with opposite philicity to the substrate).

Particularly suitable hydrophilic substrate for a wet lithographic plate is an aluminum support that has been grained and anodized; such a substrate is preferably further deposited with a hydrophilic barrier layer. Surface graining can be achieved by mechanical graining or brushing, chemical etching, and/or AC electrochemical graining. The roughened surface can be further anodized to form a durable aluminum oxide surface using an acid electrolyte such as sulfuric acid and/or phosphoric acid. The roughened and anodized aluminum surface can be further thermally or electrochemically coated with a layer of silicate or hydrophilic polymer such as polyvinyl phosphonic acid, polyacrylamide, polyacrylic acid, polybasic organic acid, copolymers of vinyl phosphonic acid and acrylamide to form a durable hydrophilic layer. Polyvinyl phosphonic acid and its copolymers are preferred polymers. Processes for coating a hydrophilic barrier layer on aluminum in lithographic plate application are well known in the art, and examples can be found in U.S. Pat. Nos. 2,714,066, 4,153, 461, 4,399,021, and 5,368,974. Suitable polymer film supports for a wet lithographic plate include a polymer film coated with a hydrophilic layer, preferably a hydrophilic layer that is crosslinked, as described in U.S. Pat. No. 5,922,502.

For the plate of this application, at least the hardened areas of the photosensitive layer exhibit an affinity or aversion substantially opposite to the affinity or aversion of the substrate to at least one printing liquid selected from the group consisting of ink and an adhesive fluid for ink (including both plates with non-phase-switchable photosensitive layer and plates with phase-switchable photosensitive layer). Preferably, the photosensitive layer exhibits an affinity or aversion substantially opposite to the affinity or aversion of the substrate to at least one printing liquid selected from the group consisting of ink and an adhesive fluid for ink (as for plates with non-phase-switchable photosensitive layer, which can be wet plate or waterless plate). More preferably, the plate has a hydrophilic substrate and an oleophilic photosensitive layer (as for wet plate with non-phase-switchable photosensitive layer). An adhesive fluid for ink is a fluid that repels ink. Fountain solution is the most commonly used adhesive fluid for ink. A wet plate is printed on a wet press equipped with both ink and fountain solution, while a waterless plate is printed on a waterless press equipped with ink.

Usually, as for most printing plates described in the literature, the photosensitive layer exhibits an affinity or aversion substantially opposite to the affinity or aversion of the substrate to at least one printing liquid selected from the group consisting of ink and an abhesive fluid for ink, and does not switch its affinity or aversion upon laser exposure. However, certain photosensitive layer exhibits substantially the same affinity or aversion as the substrate and is capable of switching to opposite affinity or aversion upon exposure to a laser (with or without further treatment such as on-press development with ink and/or fountain solution), as described in U.S. Pat. Nos. 6,331,375, 5,910,395, 6,720,464, and 6,136,503. Both non-phase-switchable photosensitive layer and phase-switchable photosensitive layer can be used for the current invention. Preferred is a non-phase-switchable photosensitive layer (coated on a substrate with opposite affinity or aversion). More preferred is an oleophilic photosensitive layer (coated on a hydrophilic substrate).

In this patent, the term yellow or red light means yellow light, red light, or any light with a color between yellow and red such as orange light. The term safe light means a light with a certain wavelength range being cut off, including a yellow light or red light, so that it does not cause hardening of a certain photosensitive layer. The term white light means a white fluorescent light, a white incandescent light, sunlight, or any white office light. The term substantially no radiation below a wavelength means the intensity of the radiation below that wavelength is less than 1% of that for a regular 100-watt incandescent light (for home use, not focused) at a distance of 2 meters. The term substantial darkness means the intensity of the radiation is less than 1% of that for a regular 100-watt incandescent light at a distance of 2 meters. The term substantially light-tight means less than 1% of the room light can pass through. The term substantially all means at least 99%. The term "with the plate under a room light" means the plate is exposed to such room light; i.e., such room light reaches the plate. The term monomer includes both polymerizable monomer and polymerizable oligomer. The term (meth)acrylate includes acrylate and/or methacrylate (acrylate, methacrylate, or both acrylate and methacrylate).

For preparing lithographic printing plates of the current invention, any photosensitive layer is suitable which is soluble or dispersible in ink and/or fountain solution, and is capable of hardening upon exposure to a laser having a wavelength selected from 200 to 1200 nm. Here hardening means becoming insoluble and non-dispersible in ink and/or fountain solution. Hardening is preferably achieved through crosslinking or polymerization of the resins (polymers or monomers). A laser sensitive dye or pigment (preferably a sensitizing dye) is preferably added in the photosensitive layer. The photosensitive layer preferably has a coverage of from 100 to 3000 mg/M$^2$, more preferably from 200 to 2000 mg/m$^2$, and more preferably from 400 to 1500 mg/m$^2$.

Preferably, the photosensitive layer comprises a polymerizable monomer and an initiating system, optionally with addition of a polymeric binder. The initiating system generally comprises an initiator; an initiator and a sensitizing dye; or an initiator, a sensitizing dye and a hydrogen donor; depending on the specific photosensitive layer. Either one species (such as 1 initiator or 1 polymer) or more than one species of the same component type (such as 2 different initiators or 3 different monomers) can be added in the same photosensitive layer. The composition ratios (such as monomer to polymer ratio) are usually different from conventional plates designed for development with a regular liquid developer. Various additives may be added to, for example, allow or enhance on-press developability. Such additives include surfactant, plasticizer, water soluble polymer or small molecule, and ink soluble polymer or small molecule. The addition of nonionic surfactant is especially helpful in making the photosensitive layer dispersible with ink and fountain solution, or emulsion of ink and fountain solution. Various additives useful for conventional photosensitive layer can also be used. These additives include pigment, dye, exposure indicator, and stabilizer.

The photosensitive layer of this invention can be solid or semisolid at 25° C. In one embodiment, a semisolid photosensitive layer is preferably used to achieve fast photospeed, and/or developability with ink and/or fountain solution. Here the term semisolid photosensitive layer is defined as a photosensitive layer which, when coated on a flat and smooth surface at a thickness of at least 1 micron, is able to form fingerprints when pressed with a finger at a force (or weight) of 2 kg and is tacky to touch by fingers at 25° C.

Photosensitive materials useful in wet plates of this invention include, for example photosensitive compositions comprising a polymerizable monomer, an initiator, a sensitizing dye, and optionally a polymeric binder.

Photosensitive oleophobic materials useful in waterless plates of this invention include, for example, compositions comprising a monomer having perfluoroalkyl or polysiloxane groups and crosslinkable terminal groups, an initiator, and a sensitizing dye.

Infrared laser sensitive (also called thermosensitive) materials useful for wet lithographic plates of this invention include, for example, thermosensitive compositions comprising a polymerizable monomer, an initiator, an infrared absorbing dye, and optionally a polymeric binder.

Visible or ultraviolet light sensitive materials useful for wet plates of this invention include, for example, photosensitive compositions comprising a polymerizable monomer, an initiator, a visible or ultraviolet light sensitizing dye, and optionally a polymeric binder. A hydrogen donor is preferably added to accelerate the polymerization.

Polymeric binder for the photosensitive layer of this invention can be any solid film-forming polymer. Such polymer may or may not have (meth)acrylate groups or other ethylenic groups (such as allyl groups). Examples of suitable polymeric binders include (meth)acrylic polymers and copolymers (such as polybutylmethacrylate, polyethylmethacrylate, polymethylmethacrylate, polymethylacrylate, butylmethacrylate/methylmethacrylate copolymer, methylmethacrylate/methylmethacrylic acid copolymer, polyallylmethacrylate, and allylmethacrylate/methacrylic acid copolymer), polyvinyl acetate, polyvinyl butyrate, polyvinyl chloride, styrene/acrylonitrile copolymer, styrene/maleic anhydride copolymer and its partial ester, nitrocellulose, cellulose acetate butyrate, cellulose acetate propionate, vinyl chloride/vinyl acetate copolymer, butadiene/acrylonitrile copolymer, polyurethane binder, and polymeric binder having polymer backbone with recurring units having pendant poly(alkylene glycol) side chains. The polymeric binder suitable for the photosensitive layer of this invention has a weight average molecular weight of at least 5,000, preferably from 10,000 to 1,000,000, more preferably from 20,000 to 500,000, and most preferably from 50,000 to 200,000 Dalton. It is noted that polymeric compounds with weight average molecular weight of less that 5,000 can also be added in the photosensitive layer of this invention; however, in order to avoid confusion, such compounds are not considered as polymeric binder and are called oligomer (without or with polymerizable groups) in this application (oligomers having polymerizable groups are also included in the definition of monomers in this application).

Suitable free-radical polymerizable monomers include any monomer or oligomer with at least one ethylenically unsaturated group. Such monomers include monofuctional, difunctional, and multifunctional (meth)acrylate monomers or oligomers, such as (meth)acrylate esters of ethylene glycol, trimethylolpropane, pentaerythritol, ethoxylated ethylene glycol and ethoxylated trimethylolpropane; multifunctional urethanated (meth)acrylate; epoxylated (meth)acrylate; oligomeric amine(meth)acrylate; and phosphate ester-containing (meth)acrylate (such as phosphate ester of 2-hydroxyethyl methacrylate, and various phosphate ester containing (meth)acrylate monomers as described in U.S. Pat. Nos. 4,101,326, 5,679,485, 5,776,655 and 7,316,887, and U.S. Pat. App. No. 2008/0008957). The monomers can be urethane(meth)acrylate, or non-urethane(meth)acrylate.

Combination of both urethane(meth)acrylate and non-urethane(meth)acrylate monomers can be used. The monomers preferably has at least 3 (meth)acrylate groups, more preferably at least 4 (meth)acrylate groups, even more preferably at least 5 (meth)acrylate groups, and most preferably at least 6 (meth)acrylate groups. However, monofunctional or difunctional (meth)acrylate monomer can be added into the photosensitive layer having multifunctional (meth)acrylate monomers; the total amount of such monofunctional or difunctional monomers is preferably less than 50% by weight of the total monomers, more preferably less than 30%, and most preferably less than 10%. Acrylate monomer is preferred over methacrylate monomer because of the faster photospeed of acrylate group over methacrylate group. The monomer has a molecular weight of less than 5,000, preferably from 100 to 3,000, more preferably from 200 to 2,000, and most preferably from 300 to 1,500 Dalton.

Urethane(meth)acrylate monomers include any compounds having at least one urethane linkage (—NHCOO—) and at least one (meth)acrylate group. Preferred urethane (metha)acrylate monomers are those with at least 3 (meth)acrylate groups, more preferably at least 4 (meth)acrylate groups, even more preferably at least 5 (meth)acrylate groups, and most preferably at least 6 (meth)acrylate groups. Urethane(meth)acrylate monomer is usually formed by reacting a compound having at least one isocyanate group with a (meth)acrylate compound having a hydroxy group. Urethane monomer with 2 or more (meth)acrylate groups are usually formed from a compound having one or more isocyanate groups and a (meth)acrylate compound having a hydroxy group and one or more (meth)acrylate groups. For example, a tetrafunctional urethane(meth)acrylate monomer can be formed from a compound having one hydroxy group and 2 (meth)acrylate groups with a bifunctional isocyanate compound. Suitable isocyanate compounds include, for example, aromatic diisocyanate such as p-phenylene diisocyanate, 2,4-tolylene diisocyanate, 2,6-tolylene diisocyanate, 4,4'-diphenylmethane diisocyanate, naphthalene-1,5-diisocyanate and tolydine diisocyanate; aliphatic diisocyanate such as hexamethylene diisocyanate, lysinemethyl ester diisocyanate, 2,4,4-trimethylhexamethylene diisocyanate and dimer acid diisocyanate; alicyclic diisocyanate such as isophorone diisocyanate, and 4,4'-methylenebis(cyclohexylisocyanate); aliphatic diisocyanate having an aromatic ring, such as xylylene diisocyanate; triisocyanate such as lysine ester triisocyanate, 1,6,11-undecane triisocyanate, 1,8-diisocyanate-4-isocyanatemethyloctane, 1,3,6-hexamethylene triisocyanate, bicycloheptane triisocyanate, tris(isocyanate phenylmethane) and tris(isocyanatephenyl)thiophosphate; and polyisocyanate formed from condensation of three or more diisocyanate compounds such as 2,4-tolylene diisocyanate isocyanurate trimer, 2,4-tolylene diisocyanate-trimethylolpropane adduct, 1,6-hexanediisocyante isocyanurate trimer. Suitable (meth)acrylate compounds with one hydroxy group include pentaerythritol tri(meth)acrylate, dipentaerythritol penta(meth)acrylate, ditrimethylolpropane tri(meth)acrylate and pentaerythritol di(meth)acrylate monostearate. Various urethane(meth)acrylate monomers are described in U.S. Pat. No. 6,232,038 and U.S. Pat. Pub. No. 2002/0018962, and can be used as the urethane(meth)acrylate monomers of this instant invention. Among the urethane (meth)acrylate monomers, urethane acrylate monomer is preferred. Either aromatic urethane(meth)acrylate monomer (which contains at least one aromatic group in the molecule) or aliphatic urethane(meth)acrylate monomer (which does not contain any aromatic group in the molecule) or both can be used in a photosensitive layer of this invention.

Suitable non-urethane(meth)acrylate monomers can be any (meth)acrylate monomers without urethane linkage (—NHCOO—) in the molecule. Suitable non-urethane (meth)acrylate monomers include, for example, trimethylolpropane triacrylate, pentaerythritol tetra(meth)acrylate, dipentaerythritol penta(meth)acrylate, dipentaerythritol hexa (meth)acrylate, di(trimethylolpropane)tetra(meth)acrylate. Among the non-urethane(meth)acrylate monomers, non-urethane acrylate monomer is preferred.

Suitable free-radical initiators include, for example, the derivatives of acetophenone (such as 2,2-dimethoxy-2-phenylacetophenone, and 2-methyl-1-[4-(methylthio)phenyl]-2-morpholino propan-1-one), onium salts such as diaryliodoniun hexafluoroantimonate, diaryliodonium hexafluorophosphate, diaryliodonium triflate, (4-(2-hydroxytetradecyl-oxy)phenyl)phenyliodonium hexafluoroantimonate, (4-octoxyphenyl)phenyliodonium hexafluoroantimonate, bis(4-t-butylphenyl)iodonium hexafluorophosphate, triarylsulfonium hexafluorophosphate, triarylsulfonium p-toluenesulfonate, (3-phenylpropan-2-onyl)triaryl phosphonium hexafluoroantimonate and N-ethoxy(2-methyl)pyridinium hexafluorophosphate, and the onium salts as described in U.S. Pat. Nos. 5,955,238, 6,037,098 and 5,629,354; borate salts such as tetrabutylammonium triphenyl(n-butyl)borate, tetraethylammonium triphenyl(n-butyl)borate, diphenyliodonium tetraphenylborate, and triphenylsulfonium triphenyl(n-butyl)borate, and the borate salts as described in U.S. Pat. Nos. 6,232,038 and 6,218,076; haloalkyl substituted s-triazines such as 2,4-bis(trichloromethyl)-6-(p-methoxy-styryl)-s-triazine, 2,4-bis(trichloromethyl)-6-(4-methoxy-naphth-1-yl)-s-triazine, 2,4-bis(trichloromethyl)-6-piperonyl-s-triazine, and 2,4-bis (trichloromethyl)-6-[(4-ethoxyethylenoxy)-phen-1-yl]-s-triazine, and the s-triazines as described in U.S. Pat. Nos. 5,955,238, 6,037,098, 6,010,824, and 5,629,354; titanocene compounds such as bis($\eta^9$-2,4-cyclopentadien-1-yl)bis[2,6-difluoro-3-(1H-pyrrol-1-yl)phenyl)titanium; hexaarylbiimidazole compounds such as 2,2'-bis(2-chlorophenyl)-4,4',5,5'-tetraphenyl-1,1-biimidazole, 2,2'-bis(2-ethoxyphenyl)-4,4', 5,5'-tetraphenyl-1,1'-biimidazole, 2-(1-naphthyl)-4,5-diphenyl-1,2'-biimidazole; and derivatives of acetophenone such as 2,2-dimethoxy-2-phenylacetophenone, and 2-methyl-1-[4-(methylthio)phenyl]-2-morpholino propan-1-one. Triarylsulfonium salts, diaryliodonium salts, and triarylalkylborate salts are preferred initiators for infrared laser sensitive plate. Titanocene compounds and hexaarylbiimidazole compounds are preferred initiators for visible or ultraviolet laser sensitive plate, and hexaarylbiimidazole compounds are more preferred. The initiator is added in the photosensitive layer preferably at 0.1 to 40% by weight of the photosensitive layer, more preferably 1 to 30%, and most preferably 5 to 20%.

Infrared sensitizing dyes useful in the thermosensitive layer of this invention include any infrared absorbing dye effectively absorbing an infrared radiation having a wavelength of 750 to 1200 nm. It is preferable that the dye has an absorption maximum between the wavelengths of 780 and 1100 nm. Various infrared absorbing dyes are described in U.S. Pat. Nos. 5,858,604, 5,922,502, 6,022,668, 5,705,309, 6,017,677, and 5,677,106, and in the book entitled "Infrared Absorbing Dyes" edited by Masaru Matsuoka, Plenum Press, New York (1990), and can be used in the thermosensitive layer of this invention. Examples of useful infrared absorbing dyes include squarylium, croconate, cyanine (including polymethine), phthalocyanine (including naphthalocyanine), merocyanine, chalcogenopyryloarylidene, oxyindolizine, quinoid, indolizine, pyrylium and metal dithiolene dyes. Cyanine and phthalocyanine dyes are preferred infrared absorbing dyes. The infrared laser sensitizing dye is added in the photosensitive layer preferably at 0.1 to 20% by weight of the photosensitive layer, more preferably 0.5 to 10%, and most preferably 1 to 5%.

Visible or ultraviolet sensitizing dyes useful in the visible or ultraviolet sensitive photosensitive layer of this invention include any dyes having a wavelength maximum of from 200 to 600 nm. Suitable visible or ultraviolet sensitive dyes include, for example, cyanine dyes; rhodamine compounds such as rhodamine 6G perchloride; chromanone compounds such as 4-diethylaminobenzilidene chromanone; dialkylaminobenzene compounds such as ethyl 4-dimethylaminobenzoate and dialkylaminobenzene; dialkylaminobenzophenone compounds such as 4,4'-bis(dimethylamino)benzophenone, 4,4'-bis(diethylamino)benzophenone, 2-(p-dimethylaminophenyl)benzooxazole, 2-(p-diethylaminophenyl)benzooxazole, 2-(p-dimethylaminophenyl)benzo[4,5]benzooxazole, 2-(p-dimethylaminophenyl)benzo[6,7]benzooxazole, 2,5-bis(p-diethylaminopbenyl)1,3,4-oxazole, 2-(p-dimethylaminophenyl)benzothiazole, 2-(p-diethylaminophenyl)benzothiazole, 2-(p-dimethylaminophenyl)benzimidazole, 2-(p-diethylaminophenyl)benzimidazole, 2,5-bis(p-diethylaminophenyl)1,3,4-thiadiazole, (p-dimethylaminophenyl)pyridine, (p-diethylaminophenyl)pyridine, 2-(p-dimethylaminophenyl)quinoline, 2-(p-diethylaminophenyl)quinoline, 2-(p-dimethylaminophenyl)pyrimidine or 2-(p-diethylaminophenyl)pyrimidine; unsaturated cyclopentanone compounds such as 2,5-bis{[4-(diethylamino)phenyl]methylene}-(2E,5E)-(9Cl)-cyclopentanone and bis(methylindolenyl)cyclopentanone; coumarin compounds such as 3-benzoyl-7-methoxy coumarin and 7-methoxy coumarin; and thioxanthene compounds such as 2-isopropylthioxanthenone. Dialkylaminobenzene compounds and bis(dialkylamino)benzophenone compounds are particularly suitable for ultraviolet laser sensitive plate. Bis(dialkylamino)benzophenone compounds are particularly suitable for violet laser sensitive plate. The sensitizing dyes as described in U.S. Pat. Nos. 5,422,204 and 6,689,537, and U.S. Pat. App. Pub. No. 2003/0186165 can be used for the photosensitive layer of this invention. The visible or ultraviolet laser sensitizing dye is added in the photosensitive layer preferably at 0.1 to 20% by weight of the photosensitive layer, more preferably 0.5 to 15%, and most preferably 1 to 10%.

The free radical polymerizable photosensitive composition of the present invention can contain one or more hydrogen donors as polymerization accelerator. Examples of the hydrogen donors include compounds having a mercapto group (also called mercapto compounds) such as 2-mercaptobenzoxazole, 2-mercaptobenzothiazole, 2-mercaptobenzimidazole and 3-mercapto-1,2,4-triazole; and N-aryl-α-amino acids, their salts and esters such as N-phenylglycine, salts of N-phenylglycine, and alkyl esters of N-phenylglycine such as N-phenylglycine ethyl ester and N-phenylglycine benzyl ester. Preferred hydrogen donors are mercapto compounds and N-aryl-α-amino acids, their sails and esters; more preferred are mercapto compounds. Combination of at least one mercapto compound and at least one N-aryl-α-amino acid or its ester or salt can be advantageously used in the photosensitive layer. The hydrogen donor is preferably added in the photosensitive layer at 0.01 to 15% by weight of the photosensitive layer, more preferably 0.1 to 10%, and most preferably 0.5 to 5%.

Various surfactants can be added into the photosensitive layer to allow or enhance the on-press developability with ink and/or fountain. Both polymeric and small molecule surfactants can be used. However, it is preferred that the surfactant has low or no volatility so that it will not evaporate from the photosensitive layer of the plate during storage and handling. Nonionic surfactants are preferred. The nonionic surfactant used in this invention should have sufficient portion of hydrophilic segments (or groups) and sufficient portion of oleophilic segments (or groups), so that it is at least partially soluble in water and at least partially soluble in organic phase. Preferred nonionic surfactants are polymers and oligomers containing one or more polyether (such as polyethylene glycol, polypropylene glycol, and copolymer of ethylene glycol and propylene glycol) segments. Examples of preferred nonionic surfactants are block copolymers of propylene glycol and ethylene glycol (also called block copolymer of propylene oxide and ethylene oxide); ethoxylated or propoxylated acrylate oligomers; and polyethoxylated alkylphenols and polyethoxylated fatty alcohols. The nonionic surfactant is preferably added at from 0.1 to 30% by weight of the photosensitive layer, more preferably from 0.5 to 20%, and most preferably from 1 to 15%.

For plates with rough and/or porous surface capable of mechanical interlocking with a coating deposited thereon, a thin water-soluble interlayer may be deposited between the substrate and the photosensitive layer. Here the substrate surface is rough and/or porous enough and the interlayer is thin enough to allow bonding between the photosensitive layer and the substrate through mechanical interlocking. Such a plate configuration is described in U.S. Pat. No. 6,014,929, the entire disclosure of which is hereby incorporated by reference. Preferred releasable interlayer comprises a water-soluble polymer. Polyvinyl alcohol (including various water-soluble derivatives of polyvinyl alcohol) is the preferred water-soluble polymer. Usually pure water-soluble polymer is coated. However, one or more surfactant and other additives may be added. The water-soluble polymer is generally coated from an aqueous solution with water as the only solvent. A water-soluble organic solvent, preferably an alcohol such as ethanol or isopropanol, can be added into the water-soluble polymer aqueous coating solution to improve the coatability. The water-soluble organic solvent is preferably added at less than 20% by weight of the solution, more preferably at less than 10%. The releasable interlayer preferably has an average coverage of 1 to 200 mg/m$^2$, more preferably 2 to 100 mg/m$^2$, and most preferably 4 to 40 mg/m$^2$. The substrate preferably has an average surface roughness Ra of 0.2 to 2.0 microns, and more preferably 0.4 to 1.0 microns.

In a preferred embodiment for the thermosensitive lithographic printing plate of this invention, the thermosensitive layer comprises a polymeric binder, a polymerizable monomer having at least one terminal ethylenic group, a free-radical initiator, and an infrared absorbing dye. Other additives such as surfactant, dye or pigment, exposure-indicating dye (such as leuco crystal violet, leucomalachite green, azobenzene, 4-phenylazodiphenylamine, and methylene blue dyes), and free-radical stabilizer (such as methoxyhydroquinone) may be added. The weight ratio of all the monomers to all the polymeric binders is preferably at least 1.0, more preferably at least 1.5, and most preferably at least 2.0.

In another preferred embodiment for the thermosensitive lithographic plates of this invention, the thermosensitive layer comprises a polymeric binder, a urethane(meth)acrylate monomer having at least 4 (meth)acrylate groups, a free-radical initiator, and an infrared absorbing dye. A mercapto group-containing compound is preferably added. The weight ratio of all the monomers to all the polymeric binders is preferably at least 1.0, more preferably at least 1.5, and most preferably at least 2.0.

In yet another preferred embodiment for the thermosensitive lithographic plates of this invention, the thermosensitive layer comprises a polymeric binder having polymer backbone with recurring units having pendant poly(alkylene glycol) side chains, a (meth)acrylate monomer having at least one (meth)acrylate group, a free-radical initiator, and an infrared absorbing dye. A mercapto group-containing compound is preferably added. The weight ratio of all the monomers to all the polymeric binders is preferably at least 1.0, more preferably at least 1.5, and most preferably at least 2.0.

In further another preferred embodiment for the thermosensitive lithographic plates of this invention, the thermosensitive layer comprises a polymeric binder, a urethane (meth)acrylate monomer having at least 4 (meth)acrylate groups, a phosphate ester-containing (meth)acrylate monomer, a free-radical initiator, and an infrared absorbing dye. A mercapto group-containing compound is preferably added. The weight ratio of all the monomers to all the polymeric binders is preferably at least 1.0, more preferably at least 1.5, and most preferably at least 2.0.

In yet further another preferred embodiment for the thermosensitive lithographic plates of this invention, the thermosensitive layer comprises a polymeric binder, a urethane (meth)acrylate monomer having at least 4 (meth)acrylate groups a non-urethane(meth)acrylate monomer having at least 4 (meth)acrylate groups, a free-radical initiator, and an infrared absorbing dye. The weight ratio of all the monomers to all the polymeric binders is preferably at least 1.0, more preferably at least 1.5, and most preferably at least 2.0.

In a preferred embodiment for visible light sensitive lithographic printing plates of this invention, the photosensitive layer comprises a polymeric binder, a polymerizable monomer having at least one terminal ethylenic group, a free-radical initiator, and a visible sensitizing dye. A hydrogen donor is preferably added. Other additives such as surfactant, dye or pigment, exposure-indicating dye, and free-radical stabilizer may be added. The weight ratio of all the monomers to all the polymeric binders is preferably at least 1.0, more preferably at least 1.5, and most preferably at least 2.0.

In a preferred embodiment for violet or ultraviolet light sensitive lithographic printing plates of this invention, the photosensitive layer comprises a polymeric binder, a polymerizable monomer having at least one terminal ethylenic group, a free-radical initiator, and a violet or ultraviolet sensitizing dye. A hydrogen donor is preferably added. Other additives such as surfactant, dye or pigment, exposure-indicating dye, and free-radical stabilizer may be added. The weight ratio of all the monomers to all the polymeric binders is preferably at least 1.0, more preferably at least 1.5, and most preferably at least 2.0.

In another preferred embodiment for the violet or ultraviolet laser sensitive lithographic plates of this invention, the photosensitive layer comprises a polymeric binder, a monomer having at least 3 (meth)acrylate group, a hexaarylbiimidazole or titanocene compound, and a dialkylaminobenzophenone compound. A mercapto group-containing compound is preferably added. The weight ratio of the all the monomers to all the polymeric binders is preferably at least 1.0, more preferably from 1.5 to 6.0, and most preferably from 2.0 to 5.0. A hexaarylbiimidazole compound is preferred among hexaarylbiimidazole and titanocene compounds. A preferred dialkylaminobenzophenone compound is a 4,4'-bis(dialkylamino)benzophenone compound.

In yet another preferred embodiment for the violet or ultraviolet laser sensitive lithographic plates of this invention, the photosensitive layer comprises a polymeric binder, a urethane monomer having at least 4 (meth)acrylate groups, a hexaarylbiimidazole or titanocene compound, and a dialkylaminobenzophenone compound. A mercapto group-containing compound is preferably added. The weight ratio of the all the monomers to all the polymeric binders is preferably at least 0.5, more preferably from 1.0 to 6.0, and most preferably from 2.0 to 5.0. A hexaarylbiimidazole compound is preferred among hexaarylbiimidazole and titanocene compounds. A preferred dialkylaminobenzophenone compound is a 4,4'-bis(dialkylamino)benzophenone compound. A non-urethane(meth)acrylate monomer is preferably added.

In further another preferred embodiment for the violet or ultraviolet laser sensitive lithographic plates of this invention, the photosensitive layer comprises a polymeric binder, a urethane monomer having at least 4 (meth)acrylate groups, a non-urethane monomer having at least 4 (meth)acrylate groups, a free radical initiator, and a violet or ultraviolet sensitizing dye. A mercapto group-containing compound is preferably added. The weight ratio of the urethane(meth)acrylate monomer to the non-urethane(meth)acrylate monomer is preferably from 0.10 to 10.0, more preferably from 0.20 to 5.0, and most preferably from 0.30 to 3.0. The weight ratio of all the monomers to all the polymeric binders is preferably at least 0.5, more preferably from 1.0 to 6.0, even more preferably from 1.5 to 5.0, and most preferably from 2.0 to 4.0. A preferred free radical initiator is a hexaarylbiimidazole or titanocene compound, more preferably a hexaarylbiimidazole compound. A preferred sensitizing dye is a dialkylaminobenzophenone compound, more preferably a 4,4'-bis(dialkylamino)benzophenone compound.

In yet further another preferred embodiment for the violet or ultraviolet laser sensitive lithographic plates of this invention, the photosensitive layer comprises a polymeric binder having polymer backbone with recurring units having pendant poly(alkylene glycol) side chains, a (meth)acrylate monomer having at least one (meth)acrylate group, a free-radical initiator, and a violet or ultraviolet sensitizing dye. A mercapto group-containing compound is preferably added. Other additives such as surfactant, dye or pigment, exposure-indicating dye, and free-radical stabilizer may be added.

In also further another preferred embodiment for the violet or ultraviolet laser sensitive lithographic plates of this invention, the photosensitive layer comprises a polymeric binder, a urethane monomer having at least 4 (meth)acrylate groups, a phosphate ester-containing (meth)acrylate monomer, a free radical initiator, and a violet or ultraviolet sensitizing dye. A mercapto group-containing compound is preferably added. The weight ratio of the all the monomers to all the polymeric binders is preferably at least 0.5, more preferably from 1.0 to 6.0, and most preferably from 2.0 to 5.0. A preferred free radical initiator is a hexaarylbiimidazole or titanocene compound, more preferably a hexaarylbiimidazole compound. A preferred sensitizing dye is a dialkylaminobenzophenone compound, more preferably a 4,4'-bis(dialkylamino)benzophenone compound. A phosphate-free non-urethane(meth)acrylate monomer can be added.

The overcoated on-press developable lithographic plates as described in U.S. Pat. Nos. 6,482,571, 6,576,401, 5,548,222 and 6,541,183, and U.S. patent application Ser. Nos. 10/720,882, 11/075,663, 11/175,518, 11/266,817, 11/356,911, 11/728,648, 11/787,878, 11/800,634 and 11/810,710, the entire disclosures of which are hereby incorporated by reference, can be used for the instant invention.

The laser for the imagewise exposure in this application can be any laser having a wavelength selected from 200 to 1200 nm which is capable of causing hardening to the photosensitive layer, preferably a violet or ultraviolet laser of from 200 to 430 nm or an infrared laser of 750 to 1200 nm.

Infrared lasers useful for the imagewise exposure of the thermosensitive plates of this invention include laser sources emitting in the near infrared region, i.e. emitting in the wavelength range of from 750 to 1200 nm, and preferably from 800 to 1100 nm. Particularly preferred infrared laser sources are laser diodes emitting around 830 nm or a NdYAG laser emitting around 1060 nm. The plate is exposed at a laser dosage that is sufficient to cause hardening in the exposed areas but not high enough to cause substantial thermal ablation. The exposure dosage is preferably from 1 to 500 mJ/cm$^2$ more preferably from 5 to 200 mJ/cm$^2$, and most preferably from 20 to 150 mJ/cm$^2$, depending on the sensitivity of the thermosensitive layer.

Visible lasers useful for the imagewise exposure of the visible light sensitive plates of this invention include any laser emitting in the wavelength range of from 390 to 600 nm. Examples of suitable visible lasers include frequency-doubled Nd/YAG laser (about 532 nm), argon ion laser (about 488 nm), violet diode laser (about 405 nm), and visible LEDs. Violet laser diode is especially useful because of its small size and relatively low cost. The exposure dosage is preferably from 0.0001 to 5 mJ/cm$^2$ (0.1 to 5000 μJ/cm$^2$), more preferably from 0.001 to 0.5 mJ/cm$^2$ (1 to about 500 μJ/cm$^2$), and most preferably from 0.005 to 0.10 μJ/cm$^2$ (5 to 100 μJ/cm$^2$), depending on the sensitivity of the photosensitive layer.

Ultraviolet lasers useful for the imagewise exposure of the ultraviolet light sensitive plates of this invention include any laser having a wavelength of from 200 to 390 nm. Examples of ultraviolet lasers include ultraviolet diode lasers or LEDs having a wavelength of from 350 to 390 nm. Laser diodes are preferred ultraviolet lasers. The exposure dosage is preferably from 0.0001 to 5 mJ/cm$^2$ (0.1 to 5000 μJ/cm$^2$), more preferably from 0.001 to 0.5 mJ/cm$^2$ (1 to about 500 μJ/cm$^2$), and most preferably from 0.005 to 0.10 mJ/cm$^2$ (5 to 100 μJ/cm$^2$), depending on the sensitivity of the photosensitive layer.

Among the visible and ultraviolet lasers, violet or ultraviolet laser with a wavelength selected from 200 to 430 nm, preferably from 300 to 430 nm, is particularly useful.

Laser imaging devices are currently widely available commercially. Any device can be used which provides laser exposure to the plate according to digital imaging information. Commonly used imaging devices include flatbed imager, internal drum imager, and external drum imager, all of which can be used for the imagewise laser exposure in this invention.

The plate can be exposed with a laser on an laser imager, stripped off the overcoat (preferably on an overcoat removing device, which can be standalone or can be connected to or part of the laser imager, preferably connected to or part of the laser imager), and then mounted on press to develop with ink and/or fountain solution and then print out regular printed sheets. The ink and/or fountain solution solubilized or dispersed photosensitive layer and/or overcoat can be mixed into the ink and/or the fountain solution on the rollers, and/or can be transferred to the blanket and then the receiving medium (such as paper). The fountain solution roller is engaged (to the plate cylinder as for conventional inking system or to the ink roller as for integrated inking system) for preferably 0 to 100 rotations, more preferably 1 to 50 rotations and most preferably 5 to 20 rotations (of the plate cylinder), and the ink roller is then engaged to the plate cylinder for preferably 0 to 100 rotations, more preferably 1 to 50 rotations and most preferably 5 to 20 rotations before engaging the plate cylinder and feeding the receiving medium. Good quality prints should be obtained preferably under 40 initial impressions, more preferably under 20 impressions, and most preferably under 5 impressions (of printed sheets).

For conventional wet press, usually fountain solution is applied (to contact the plate) first, followed by contacting with ink roller. For press with integrated inking/dampening system, the ink and fountain solution are emulsified by various press rollers before being transferred to the plate as emulsion of ink and fountain solution. However, in this invention, the ink and fountain solution may be applied at any combination or sequence, as needed for the plate. There is no particular limitation.

The ink used in this application can be any ink suitable for lithographic printing. Most commonly used lithographic inks include "oil based ink" which crosslinks upon exposure to the oxygen in the air and "rubber based ink" which does not crosslink upon exposure to the air. Specialty inks include, for example, radiation-curable ink and thermally curable ink. An ink is an oleophilic, liquid or viscous material which generally comprises a pigment dispersed in a vehicle, such as vegetable oils, animal oils, mineral oils, and synthetic resins. Various additives, such as plasticizer, surfactant, drier, drying retarder, crosslinker, and solvent may be added to achieve certain desired performance. The compositions of typical lithographic inks are described in "The Manual of Lithography" by Vicary, Charles Scribner's Sons, New York, and Chapter 8 of "The Radiation Curing: Science and Technology" by Pappas, Plenum Press, New York, 1992.

The fountain solution used in this application can be any fountain solution used in lithographic printing. Fountain solution is used in wet lithographic printing press to dampen the hydrophilic areas (non-image areas), repelling ink (which is hydrophobic) from these areas. Fountain solution contains mainly water, generally with addition of certain additives such as gum arabic and surfactant. Small amount of alcohol such as isopropanol can also be added in the fountain solution. Water is the simplest type of fountain solution. Fountain solution is usually neutral to mildly acidic. However, for certain plates, mildly basic fountain solution is used. The type of fountain solution used depends on the type of the plate substrate as well as the photosensitive layer. Various fountain solution compositions are described in U.S. Pat. Nos. 4,030,417 and 4,764,213.

Emulsion of ink and fountain solution is an emulsion formed from ink and fountain solution during wet lithographic printing process. Because fountain solution (containing primarily water) and ink are not miscible, they do not form stable emulsion. However, emulsion of ink and fountain solution can form during shearing, compressing, and decompressing actions by the rollers and cylinders, especially the ink rollers and plate cylinder, on a wet lithographic press. For wet press with integrated inking system, ink and fountain solution are emulsified on the ink rollers before transferred to the plate.

The laser exposed plate can be directly stripped off the overcoat. Optionally, the laser exposed plate is overall heated to an elevated temperature to further harden the exposed areas of the photosensitive layer before stripping off the overcoat. The plate is preferably heated at 50 to 200° C. for 1 to 600 seconds, more preferably 70 to 140° C. for 1 to 300 seconds, and most preferably 90 to 120° C. for 1 to 60 seconds. The plate can be heated by any method that does not cause hardening of the photosensitive layer in the non-exposed areas, such as hot plate, oven, passing-through heater, radiation heater (which does not cause photohardening of the photosensitive layer in the non-hardened areas), and hot air heater. Preferably, the plate is passed through a heater having radiation or hot air.

The plate stripped off overcoat may be further overall heated to, for example, cause further crosslinking of the hardened areas of the photosensitive layer, before on-press development. The heating can be applied through any means, such as hot plate, oven, passing-through heater, radiation heater (which does not cause photohardening of the photosensitive layer in the non-hardened areas), and hot air heater. Preferably, the plate is passed through a heater having radiation or hot air. More preferably, the plate is passed through a heater which is part of or connected to an overcoat removing device.

The plate stripped off overcoat may be further overall exposed with a second radiation to, for example, cause further crosslinking of the photosensitive layer in the hardened areas, without causing hardening of the non-hardened areas, before on-press development. The radiation for the overall exposure can be applied with any exposure method which delivers radiation to the whole photosensitive layer; preferably on an overall exposure device having a lamp by either fixing the plate on the device or passing the plate through; more preferably by passing through a radiation from a lamp on an overall exposure device. Here the radiation as applied is incapable of causing hardening of the particular photosensitive layer without overcoat.

The imagewise laser exposure and the overcoat removal of this invention can be performed with the plate under any lightings (including darkness) at least for certain amount of time, as long as the exposure to such lightings for such amount of time will not cause hardening of the photosensitive layer; such lighting can be a yellow or red light (for preferably limited time, more preferably less than 120 minutes, and most preferably less than 30 minutes), darkness or substantial darkness, or white light (for preferably limited time, more preferably less than 60 minutes, and most preferably less than 10 minutes). Preferably, the laser exposure is performed with the plate under lightings (including darkness) that will not cause hardening of the photosensitive layer (even after long exposure); more preferably, under lightings containing no or substantially no radiation below a wavelength selected from 400 to 650 nm (such as 500 nm), or in darkness or substantial darkness; and most preferably under lightings containing no radiation below a wavelength selected from 400 to 650 nm, or in darkness. The lighting containing no or substantially no radiation below a wavelength selected from 400 to 650 nm (such as 500 nm) is usually a yellow or red light. This includes a light that is from a fluorescent or incandescent lamp covered with a filter that cuts off all or substantially all (at least 99%) of the radiation below a wavelength selected from 400 to 650 nm; preferably the lamp is covered with a filter that cuts off all of the radiation below a wavelength selected from 400 to 650 nm. The laser exposure and the overcoat removal can be performed with the plate under the same or different lightings.

The plate can be imagewise exposed on a laser imager and then stripped off the overcoat on an overcoat removing device. The plate can be manually or automatically handled between the imager and the overcoat removing device. The imager and the overcoat removing device may stay open to the room light which is a white light or a yellow or red light, preferably a yellow or red light, depending on the sensitivity of the plate. For plate sensitive to the room light, the exposure time to such room light should be limited (to preferably less than 120 minutes and more preferably less than 20 minutes).

For a plate with very limited room light stability before the removal of the overcoat (such as causing hardening or background toning after exposure to a yellow light for 60 minutes or to a white tight for 10 minutes), the plate can be imaged on a laser imager, and stripped off the overcoat on a overcoat removing device, preferably in a room which has a lighting that contains no or substantially no radiation below a wavelength selected from 400 to 650 nm; the plate can be manually or automatically handled between the imager and overcoat removing device; the imager and overcoat removing device can stay open to the room light. Alternatively, the plate can be packaged in a substantially light-tight cassette to feed to the exposure device that is designed to be substantially light-tight for the plate, with the plate covered with substantially light-tight covers; the plate can be automatically transferred to the overcoat removing device, with the plate staying within the substantially light-tight covers all or substantially all the time until it has been stripped off the overcoat; the room lighting can be a white light. Further alternatively, the above automatic processes can be designed so that the substantially light-tight covers have some light-filtering windows which are only transparent to radiation above a wavelength selected from 400 to 650 nm (such as 500 nm), so that the operator can visually monitor the plate during imaging, and/or overcoat removal.

The on-press development can be performed with the plate under any visible light such as a white room light or a yellow or red room light, preferably under a white room light. For laser imaged and overcoat-removed plate with limited stability to a white light, the handling time under the white light during and before on-press development should be short enough so that the photosensitive layer in the non-imaged areas does not become hardened or cause background toning of the substrate. Preferably, the laser imaged and overcoat-removed plate is sufficiently stable so that no hardening or toning occurs in the non-imaged areas for up to at least 60 minutes, more preferably at least 300 minutes, and most preferably for any amount of time. This will allow free or freer handling of the overcoat-removed plate under white room light during and before on-press development.

The laser imaged and overcoat-removed plate can be directly mounted on press for development with ink and/or fountain solution, or can be stacked together with other laser imaged and overcoat-removed plates before mounting on-press for development. In one preferred embodiment, two or more plates are stacked together after imaging and overcoat removal, and then one plate at a time is picked up to mount on press for development with ink and/or fountain solution and lithographic printing. The stack of plates is preferably under a white room light, at least for a limited time. The removal of the overcoat improves the room light stability of the imaged plate, allowing freer handling of the imaged plate, such as imaging and overcoat stripping two or more plates and stacking them together, and then mounting one or more plates on press at a later time.

This invention is further illustrated by the following examples of its practice.

Examples 1-8

An electrochemically grained, anodized and polyvinyl phosphonic acid treated aluminum substrate was coated with a thermosensitive layer formulation PS-1 with a #6 Meyer rod, followed by drying in an oven at 100° C. for 2 min.

| PS-1 | |
|---|---|
| Component | Weight (g) |
| Neocryl B-728 (Polymer from Zeneca) | 2.50 |
| Ebecryl 220 (Acrylate monomer from UCB Chemicals) | 5.99 |
| Pluronic L43 (Nonionic surfactant from BASF) | 0.40 |

PS-1

| Component | Weight (g) |
|---|---|
| (4-(2-Hydroxytetradecyl-oxy)phenyl)phenyliodonium hexafluorophosphate | 1.00 |
| PINA KF-1151 (Infrared absorbing polymethine dye from Allied Signal) | 0.10 |
| 2-Butanone | 90.00 |

The thermosensitive layer coated plate was further coated with a water-soluble overcoat OC-1 using a #6 Meyer rod, followed by hot air blow drying and baking in an oven at 100° C. for 2 min.

OC-1

| Component | Weight (g) |
|---|---|
| Airvol 203 (polyvinyl alcohol from Air Products) | 4.84 |
| Silwet 7604 (Surfactant from Union Carbide) | 0.02 |
| Triton X-100 (Surfactant from www.chemistrystore.com) | 0.14 |
| Water | 95.00 |

The coated plate was exposed with an infrared laser imager equipped with laser diodes emitting at about 830 nm (Trendsetter from Creo) at a dosage of about 200 mJ/cm$^2$. The exposed areas of the plate showed brown color, with the non-exposed areas remain light green. The exposed plate was cut into 8 pieces for further tests. Unless indicated otherwise, the plates were tested under a yellow light, and stored in a light-tight box between tests.

The 1$^{st}$ piece was stripped off the overcoat with a pressure sensitive adhesive tape (Scotch Brand packaging tape from 3M). The adhesive tape was taped to the coated side of the plate, and then pulled away from the plate. The overcoat in the taped areas came out with the tape and was removed from the plate. The same procedure was repeated for the rest areas of the plate, until the overcoat in the whole plate piece was removed. The 2$^{nd}$, 3$^{rd}$ and 4$^{th}$ pieces were stripped off the overcoat with the same procedure as for the 1$^{st}$ piece. The 5$^{th}$, 6$^{th}$, 7$^{th}$ and 8$^{th}$ pieces were not stripped.

The plate pieces were then exposed to an office white fluorescent light (total of 80 watts at about 2 meters) for various amounts of time as listed in Table 1, to test white light stability.

Each of the above plate pieces was tested on a wet lithographic press AB Dick 360. The press tests were performed under a white fluorescent light. Each plate was exposed to the white fluorescent light for about 5 minutes during the handling, mounting, and on-press development before being developed with ink and/or fountain solution. The plate was directly mounted on the plate cylinder of the press. After starting the press, the fountain roller was engaged for 20 rotations, the ink roller (carrying emulsion of ink and fountain solution) was applied to the plate cylinder for 20 rotations, and the plate cylinder was then engaged with the blanket cylinder and printed with paper for 200 impressions. The printed sheets were evaluated for on-press developability of the plate, with the results summarized in Table 1.

TABLE 1

| | | Performance on AB Dick 360 lithographic press | | |
|---|---|---|---|---|
| Overcoat Stripping | Exposure time to white room light | Background at 20 impressions | Background at 200 impressions | Inking in imaging areas |
| Stripped | None | Clean | Clean | Good |
| Stripped | 30 minutes | Clean | Clean | Good |
| Stripped | 120 minutes | Clean | Clean | Good |
| Stripped | 300 minutes | Clean | Clean | Good |
| Non-stripped | None | Clean | Clean | Good |
| Non-stripped | 30 minutes | Slightly toning | Clean | Good |
| Non-stripped | 120 minutes | Toning | Toning | Good |
| Non-stripped | 300 minutes | Heavy toning | Heavy toning | Good |

Example 9-12

An electrochemically roughened, anodized, and phosphate fluoride treated aluminum sheet was first coated with a 0.1% aqueous solution of polyvinyl alcohol (Airvol 540, from Air Products) with a #6 Meyer rod, followed by drying in an oven at 100° C. for 2 min. The polyvinyl alcohol coated substrate was further coated with the thermosensitive layer formulation PS-2 with a #6 Meyer rod, followed by hot air blow drying and baking in an oven at 100° C. for 2 min.

PS-2

| Component | Weight ratios |
|---|---|
| Neocryl B-728 (Polymer from Zeneca) | 2.73 |
| Sartomer SR-399 (Acrylic monomer from Sartomer) | 6.52 |
| Pluronic L43 (Nonionic surfactant from BASF) | 0.56 |
| 2,4-Bis(trichloromethyl)-6-[(4-ethoxyethylenoxy)-phen-1-yl]-s-triazine | 1.00 |
| ADS-830AT (Infrared absorbing cyanine dye from American Dye Source) | 0.10 |
| Acetone | 90.0 |

The thermosensitive layer coated plate was further coated with a water-soluble overcoat OC-2 using a #18 Meyer rod, followed by hot air blow drying and baking in an oven at 100° C. for 2 min.

OC-2

| Component | Weight ratios |
|---|---|
| Airvol 205 (Polyvinyl alcohol from Air Products) | 10.0 |
| Triton X-100 (Surfactant from Union Carbide) | 0.20 |
| Water | 90.0 |

The plate was exposed with an infrared laser plate imager equipped with laser diodes emitting at about 830 nm (Trendetter from Creo). The plate was mounted on the imaging drum and exposed at a laser dosage of about 300 mJ/cm². The exposed areas showed glossier but essentially colorless imaging pattern, in contrast to the less glossy non-imaged areas. The exposed plate was cut into 4 pieces for further tests. Unless indicated otherwise, the plates were tested under a yellow light, and stored in a light-tight box between tests.

The $1^{st}$ piece was stripped off the overcoat. A pressure sensitive adhesive tape (Scotch Brand packaging tape from 3M) was taped onto the overcoat of the plate on one end, and then gently pulled away. Substantially all the overcoat of the plate piece came off as one single film. The $2^{nd}$ and $3^{rd}$ pieces were stripped off the overcoat with the same procedure as the $1^{st}$ piece. The $4^{th}$ piece was not stripped.

The $2^{nd}$ and $3^{rd}$ plate pieces were then exposed to an office white fluorescent light (total of 80 watts at about 2 meters) for 30 and 120 minutes respectively. The $1^{st}$ and $4^{th}$ plate pieces were not exposed to the office white light. The plate was then tested on press for development with ink and fountain solution and for lithographic printing.

Each of the above plates was tested on a wet lithographic press AB Dick 360. The press tests were performed under a white fluorescent light. Each plate was exposed to the white fluorescent light for about 5 minutes during the handling, mounting, and on-press development before being developed with ink and/or fountain solution. The plate was directly mounted on the plate cylinder of the press. After starting the press, the fountain roller was engaged for 20 rotations, the ink roller (carrying emulsion of ink and fountain solution) was applied to the plate cylinder for 20 rotations, and the plate cylinder was then engaged with the blanket cylinder and printed with paper for 200 impressions. The $1^{st}$, $2^{nd}$ and $3^{rd}$ plate pieces (with overcoat stripped off) showed clean background under 20 impressions, good inking, and no wearing at 200 impressions. The $4^{th}$ plate piece (with overcoat not stripped) could not be developed on press, with the overcoat remaining on the plate after contacting with ink and fountain solution for up to 200 impressions.

I claim:

1. A method of processing a lithographic printing plate, comprising in order:
    (a) providing a lithographic plate comprising (i) a substrate, (ii) a photosensitive layer, and (iii) an overcoat; wherein said photosensitive layer is soluble or dispersible in ink and/or fountain solution and capable of hardening upon exposure to a laser having a wavelength selected from 200 to 1200 nm, and said overcoat is coated onto said photosensitive layer from a solution or dispersion;
    (b) imagewise exposing said plate with said laser to cause hardening of said photosensitive layer in the exposed areas;
    (c) removing said overcoat from said plate by mechanical peeling, wherein the overcoat is removed by applying a mechanical force to pull off or drive off the overcoat from the plate as a single piece or more than one piece of film; and
    (d) developing said plate with ink and/or fountain solution on a lithographic press to remove the photosensitive layer in the non-hardened areas.

2. The method of claim 1 wherein said overcoat is coated from an aqueous solution or dispersion comprising a polymeric binder.

3. The method of claim 1 wherein said overcoat comprises a water-soluble polymer and is coated from an aqueous solution.

4. The method of claim 1 wherein said overcoat comprises a water-insoluble polymer and is coated from a water-based dispersion.

5. The method of claim 1 wherein said overcoat is peeled off from said plate as a single film.

6. The method of claim 1 wherein said overcoat is peeled off from said plate as more than one pieces of film.

7. The method of claim 1 wherein said overcoat is peeled off from said plate as many small pieces of film.

8. The method of claim 1 wherein said overcoat is incapable of being completely removed from said plate with ink and/or fountain solution on said lithographic press after contacting with the ink roller and/or fountain solution roller for up to 200 rotations of the plate cylinder.

9. The method of claim 1 wherein said overcoat has a coverage of at least 1.0 g/m².

10. The method of claim 1 wherein said on-press development is performed under a white room light, said photosensitive layer in the non-imaged areas before the removal of the overcoat is capable of hardening under said room light, and said photosensitive layer in the non-imaged areas after the removal of the overcoat is incapable of hardening under said room light.

11. The method of claim 1 wherein said on-press development is performed under a white room light, said photosensitive layer before the removal of the overcoat is capable of causing background toning of the substrate in the non-imaged areas under said room light, and said photosensitive layer after the removal of the overcoat is incapable of causing background toning of the substrate in the non-imaged areas under said room light.

12. The method of claim 1 wherein said photosensitive layer comprises a polymeric binder, a free radical polymerizable monomer, a free radical initiator, and a sensitizing dye.

13. The method of claim 1 wherein said radiation is a violet or ultraviolet laser having a wavelength selected from 200 to 430 nm.

14. The method of claim 1 wherein said radiation is an infrared laser having a wavelength selected from 750 to 1200 nm.

15. The method of claim 1 wherein said plate is supplied as a stack of at least 5 plates in the form of sheets, one plate from the top of said stack is fed to a laser imager for said laser exposure, and said plates in the stack are placed directly over one another without any interleafing paper between the plates.

16. The method of claim 1 wherein said steps (b) to (c) are performed with the plate under a yellow or red light or in darkness or substantial darkness, and said step (d) is performed with the plate under a white room light.

17. The method of claim 1 wherein said overcoat removal (step c) is performed on an overcoat removing device that is connected to or is part of a laser imager for said imagewise exposure (step b).

18. The method of claim 1 wherein said laser exposure is performed on a laser imager and said overcoat removal is performed on an overcoat removing device, and both said laser imager and said overcoat removing device are shielded with covers which prevent at least 99% of room light from reaching said plate on said device.

19. A method of processing a lithographic printing plate, comprising in order:
    (a) providing a lithographic plate comprising (i) a hydrophilic substrate, (ii) an oleophilic photosensitive layer comprising a polymeric binder, a free radical polymerizable monomer, a free radical initiator, and a sensitizing dye, and (iii) an overcoat; where said photosensitive layer is soluble or dispersible in ink and/or fountain solution and capable of hardening upon exposure to a laser having a wavelength selected from 200 to 1200 nm, and said overcoat is coated onto said photosensitive layer from an aqueous solution or dispersion comprising a water soluble polymer;

(b) imagewise exposing said plate with said laser to cause hardening of said photosensitive layer in the exposed areas;

(c) removing said overcoat from said plate by mechanical peeling, wherein the overcoat is removed by applying a mechanical force to pull off or drive off the overcoat from the plate as a single piece or more than one piece of film; and (d) contacting said plate with ink and/or fountain solution on a lithographic press to remove the photosensitive layer in the non-hardened areas.

20. A method of processing a lithographic printing plate, comprising in order:

(a) providing a lithographic plate comprising (i) a hydrophilic substrate, (ii) an oleophilic photosensitive layer comprising a polymeric binder, a free radical polymerizable monomer, a free radical initiator, and a sensitizing dye, and (iii) an overcoat; wherein said photosensitive layer is soluble or dispersible in ink and/or fountain solution and capable of hardening upon exposure to a laser having a wavelength selected from 200 to 1200 nm, and said overcoat is laminated onto said photosensitive layer from a polymeric film which is pre-coated with an adhesive layer;

(b) imagewise exposing said plate with said laser to cause hardening of said photosensitive layer in the exposed areas;

(c) peeling off said overcoat from said plate as a single film, wherein the overcoat is removed by applying a mechanical force to pull off or drive off the overcoat from the plate as a single piece or more than one piece of film; and (d) developing said plate with ink and/or fountain solution on a lithographic press to remove the photosensitive layer in the non-hardened areas.

* * * * *